United States Patent
Fujiwara et al.

(10) Patent No.: US 11,778,802 B2
(45) Date of Patent: Oct. 3, 2023

(54) SRAM CELL WORD LINE STRUCTURE WITH REDUCED RC EFFECTS

(71) Applicant: TAIWAN SEMICONDUCTOR MANUFACTURING CO., LTD., Hsinchu (TW)

(72) Inventors: Hidehiro Fujiwara, Hsinchu (TW); Wei-Min Chan, New Taipei (TW); Chih-Yu Lin, Taichung (TW); Yen-Huei Chen, Hsinchu County (TW); Hung-Jen Liao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 317 days.

(21) Appl. No.: 17/320,091

(22) Filed: May 13, 2021

(65) Prior Publication Data

US 2021/0265363 A1 Aug. 26, 2021

Related U.S. Application Data

(63) Continuation of application No. 16/562,299, filed on Sep. 5, 2019, now Pat. No. 11,024,633, which is a
(Continued)

(51) Int. Cl.
*H10B 10/00* (2023.01)
*H01L 27/02* (2006.01)
(Continued)

(52) U.S. Cl.
CPC ........... *H10B 10/12* (2023.02); *H01L 21/321* (2013.01); *H01L 21/76838* (2013.01); *H01L 23/5283* (2013.01); *H01L 27/0207* (2013.01)

(58) Field of Classification Search
CPC . H10B 10/12; H01L 21/321; H01L 21/76838; H01L 23/5283
See application file for complete search history.

(56) References Cited

U.S. PATENT DOCUMENTS 5,930,163 A 7/1999 Hara
6,812,574 B2 11/2004 Tomita
(Continued)

FOREIGN PATENT DOCUMENTS

CN 101047186 A 10/2007
CN 101110424 A 1/2008
(Continued)

*Primary Examiner* — Shih Tsun A Chou
(74) *Attorney, Agent, or Firm* — Maschoff Brennan

(57) ABSTRACT

A device is disclosed that includes a fin structure disposed below a first metal layer, extending along a column direction, and corresponding to at least one transistor of a memory bit cell, a word line disposed in the first metal layer and extending along a row direction, a first metal island disposed in the first metal layer separated from the word line, and a first connection metal line disposed in a second metal layer above the first metal layer, extending along the column direction, and configured to couple a power supply through the first metal island to the fin structure. In a layout view, the first connection metal line is separated from the fin structure, and the fin structure crosses over the word line and the first metal island. A method is also disclosed herein.

20 Claims, 15 Drawing Sheets

Related U.S. Application Data continuation of application No. 15/186,446, filed on Jun. 18, 2016, now Pat. No. 10,411,019.

(60) Provisional application No. 62/243,896, filed on Oct. 20, 2015.

(51) Int. Cl.
  *H01L 21/321* (2006.01)
  *H01L 21/768* (2006.01)
  *H01L 23/528* (2006.01)

(56) References Cited

U.S. PATENT DOCUMENTS

| | | | |
|---|---|---|---|
| 7,023,056 B2 | 4/2006 | Liaw | |
| 7,031,179 B2 | 4/2006 | Yon et al. | |
| 7,176,125 B2 | 2/2007 | Liaw | |
| 7,269,056 B1 | 9/2007 | Liaw | |
| 7,405,956 B2 | 7/2008 | Yang et al. | |
| 7,514,757 B2 | 4/2009 | Liaw | |
| 8,406,028 B1 | 3/2013 | Lin | |
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 9,324,722 B1 | 4/2016 | Woo | |
| 9,704,564 B2 | 7/2017 | Liaw | |
| 2002/0113254 A1 | 8/2002 | Tomotani | |
| 2004/0196705 A1 | 10/2004 | Ishukura | |
| 2006/0038234 A1 | 2/2006 | Liaw | |
| 2006/0059449 A1 | 3/2006 | Yang et al. | |
| 2007/0235765 A1 | 10/2007 | Liaw | |
| 2008/0019171 A1 | 1/2008 | Liaw | |
| 2008/0263492 A1 | 10/2008 | Chuang et al. | |
| 2010/0213514 A1 | 8/2010 | Liaw | |
| 2012/0049374 A1 | 3/2012 | Chang et al. | |
| 2013/0154027 A1 | 6/2013 | Liaw | |
| 2013/0164931 A1 | 6/2013 | Liaw | |
| 2013/0235640 A1 | 9/2013 | Liaw | |
| 2013/0258759 A1 | 10/2013 | Liaw | |
| 2013/0272056 A1* | 10/2013 | Liaw | G11C 8/14 365/154 |
| 2014/0282326 A1 | 9/2014 | Chen et al. | |
| 2015/0333131 A1 | 11/2015 | Mojumder | |
| 2016/0233159 A1 | 8/2016 | Song | |
| 2017/0271342 A1 | 9/2017 | Fujiwara | |

FOREIGN PATENT DOCUMENTS

| | | |
|---|---|---|
| CN | 102376716 A | 3/2012 |
| CN | 103377685 A | 10/2013 |
| JP | 2004311610 A | 11/2004 |
| KR | 20050073889 A | 7/2005 |
| KR | 20060045554 A | 3/2007 |
| KR | 20100096001 A | 9/2010 |

* cited by examiner

SRAM CELL WORD LINE STRUCTURE WITH REDUCED RC EFFECTS

PRIORITY CLAIM AND CROSS-REFERENCE

The present application is a continuation Application of the U.S. application Ser. No. 16/562,299, filed Sep. 5, 2019, which is a continuation application of the U.S. application Ser. No. 15/186,446, filed Jun. 18, 2016, now U.S. Pat. No. 10,411,019, issued Sep. 10, 2019, which claims priority to U.S. Provisional Application No. 62/243,896, filed Oct. 20, 2015, all of which are herein incorporated by reference.

BACKGROUND

A typical static random-access memory (SRAM) device includes an array of memory cells arranged in columns and rows that are accessed through the operation of word lines and bit lines electrically coupled thereto. However, the RC effects of the word lines and bit lines limit the performance of the static random-access memory device seriously.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
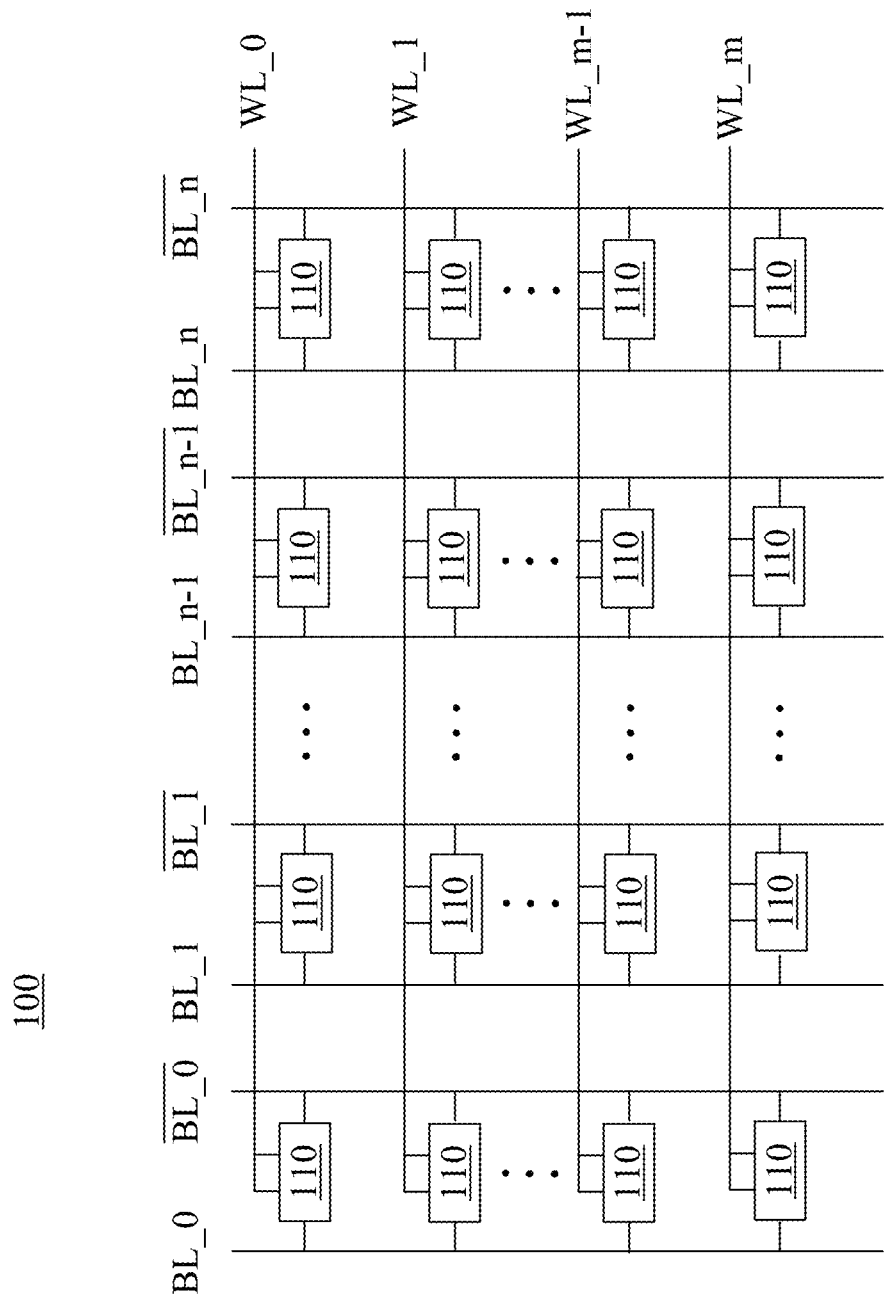
FIG. 1 is an exemplary diagram of a memory array in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

FIG. 1 is an exemplary diagram of a memory array 100 in accordance with various embodiments of the present disclosure. In some embodiments, the memory array 100 is a static random-access memory (SRAM) array. For illustration, the memory array 100 includes a plurality of memory bit cells 110, a plurality of bit lines including, for example, BL_0, . . . and BL_n, and $\overline{BL\_0}$, . . . and $\overline{BL\_n}$, and a plurality of word lines including, for example, WL_0, . . . and WL_m.

For illustration, the memory bit cells 110 are arranged in rows and columns. As illustratively shown in FIG. 1, each of the memory bit cells 110 is disposed at an intersection of one row and one column.

Each pair of the bit lines, such as the bit lines BL_0 and $\overline{BL\_0}$, are electrically coupled to one column of the memory bit cells 110. Each of the word lines WL_0, . . . and WL_m is electrically coupled to one row of the memory bit cells 110.

Based on the operation of an address decoder (not illustrated), one of the word lines WL_0, . . . and WL_m is used to select one of the rows of the memory array 100. One pair of the bit lines that correspond to one of the columns of the memory array 100 are used to perform read operation and/or write operation on the memory bit cells 110 disposed at the intersection of the corresponding row and the corresponding column.

Figure 2A:
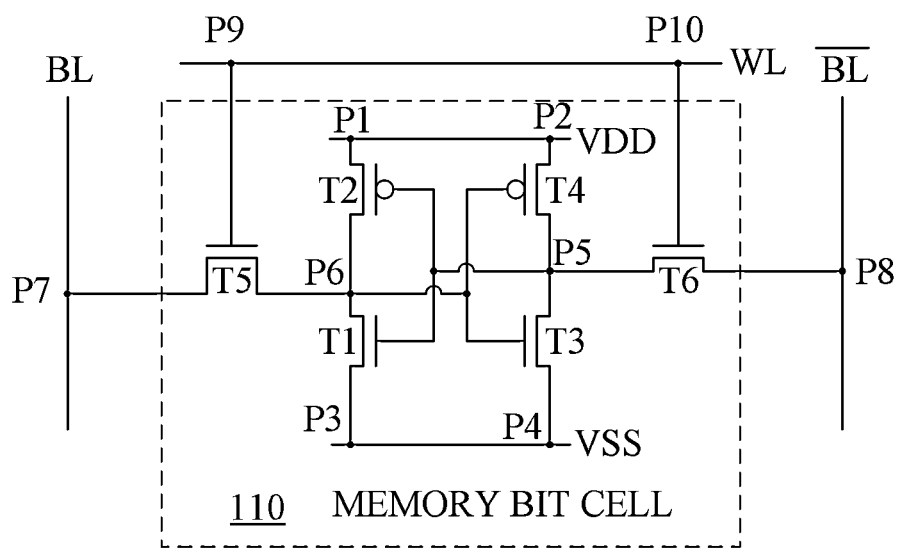
FIG. 2A is an exemplary circuit diagram of the memory device in accordance with various embodiments of the present disclosure.

FIG. 2A is an exemplary circuit diagram of the memory device 200 in accordance with various embodiments of the present disclosure. With respect to the embodiments of FIG. 1, like elements in FIG. 2A are designated with the same reference numbers for ease of understanding.

For illustration, the memory device 200 includes a memory bit cell 110 in the memory array 100 as illustrated in FIG. 1, a pair of bit lines BL and $\overline{BL}$, and a word line WL. In some embodiments, the bit lines BL and $\overline{BL}$ correspond to one pair of the bit lines as illustrated in FIG. 1, and the word line WL correspond to one of the word lines WL_0, . . . and WL_m as illustrated in FIG. 1.

For ease of understanding, only one memory bit cell 110 and the corresponding bit lines BL and $\overline{BL}$ and the word line WL are illustrated in FIG. 2A. Various numbers of the memory bit cells 110, the corresponding bit lines BL and $\overline{BL}$, and the corresponding word line WL in the memory device 200 illustrated in FIG. 2A are within the contemplated scope of the present disclosure.

In some embodiments, the length of the memory bit cell 110 ranges from about 2 to about 3 times the width of the memory bit cell 110. For illustration in FIG. 2B, the length of the memory bit cell 110 corresponds to a longer side of the memory bit cell 110, and the width of the memory bit cell 110 corresponds to a shorter side of the memory bit cell 110. In some embodiments with reference to FIG. 2D, in a plain view of the memory bit cell 110, the longer side of the memory bit cell 110 is parallel to the word line WL, and the shorter side of the memory bit cell 110 is perpendicular to the word line WL.

In some embodiments, the length of the word line WL is the same as the length of the memory bit cell 110. In some other embodiments, the total length of the word line WL in one row of the memory bit cells 110 illustrated in FIG. 1 ranges from about 4 to about 300 times the length of one memory bit cell 110.

The lengths and/or widths of the memory bit cell 110 and/or the word line WL discussed above are given for illustrative purposes. Various lengths and/or widths of the memory bit cell 110 and/or the word line WL are within the contemplated scope of the present disclosure.

In some embodiments, the memory bit cell 110 is a six-transistor (6T) cell that includes transistors T1-T6.

For illustration, the transistors T1 and T3 are N-type transistors, and the transistors T2 and T4 are P-type transistors. The transistors T1-T4 are electrically coupled to operate as two cross-coupled inverters between a power supply VDD and a power supply VSS. In some embodiments, the power supply VDD indicates a power voltage, and the power supply VSS indicates a ground voltage.

For illustration in FIG. 2A, a first source/drain of each of the transistors T2 and T4 is electrically coupled to the power supply VDD through connection points P1 and P2 respectively. A first source/drain of each of the transistors T1 and T3 is electrically coupled to the power supply VSS through connection points P3 and P4 respectively. The gates of the transistors T1 and T2 are electrically coupled to a second source/drain of each of the transistors T3 and T4 through a connection point P5 and further to a first source/drain of the transistor T6. The gates of the transistors T3 and T4 are electrically coupled to a second source/drain of each of the transistors T1 and T2 through a connection point P6 and further to a first source/drain of the transistor T5.

The second source/drain of the transistor T5 is electrically coupled to the bit line BL through a connection point P7. The second source/drain of the transistor T6 is electrically coupled to the bit line $\overline{BL}$ through a connection point P8. The gate of the transistor T5 is electrically coupled to the word line WL through a connection point P9. The gate of the transistor T6 is electrically coupled to the word line WL through a connection point P10.

As illustratively shown in FIG. 2A, the word line WL is electrically coupled to the memory bit cell 110. For illustration, the word line WL is electrically coupled to gate terminals of the transistors T5 and T6, to control the transistors T5 and T6 to turn on or turn off. Through the turn-on transistors T5 and T6, the memory bit cell 110 is coupled to the bit lines BL and $\overline{BL}$. As a result, access to the memory bit cell 110 is enabled by the word line WL which controls the two access transistors T5 and T6, which, in turn, controls whether the memory bit cell 110 is coupled to the bit lines BL and $\overline{BL}$.

As illustratively shown in FIG. 2A, the bit lines BL and $\overline{BL}$ are electrically coupled to the memory bit cell 110. For illustration, the bit line BL is electrically coupled to the transistor T5. The bit line $\overline{BL}$ is electrically coupled to the transistor T6. For further illustration, the bit line BL is electrically coupled to the source/drain terminal of the transistor T5. The bit line $\overline{BL}$ is electrically coupled to the source/drain terminal of the transistor T6. The bit lines BL and $\overline{BL}$ are used to transfer data from the transistors T1-T4 for the read operation, and/or to transfer data to the transistors T1-T4 for the write operation.

The number and the configuration of the transistors in the memory bit cell 110 in FIG. 2A are given for illustrative purposes. Various numbers and the configurations of the transistors in the memory bit cell 110 are within the contemplated scope of the present disclosure.

Figure 2B:
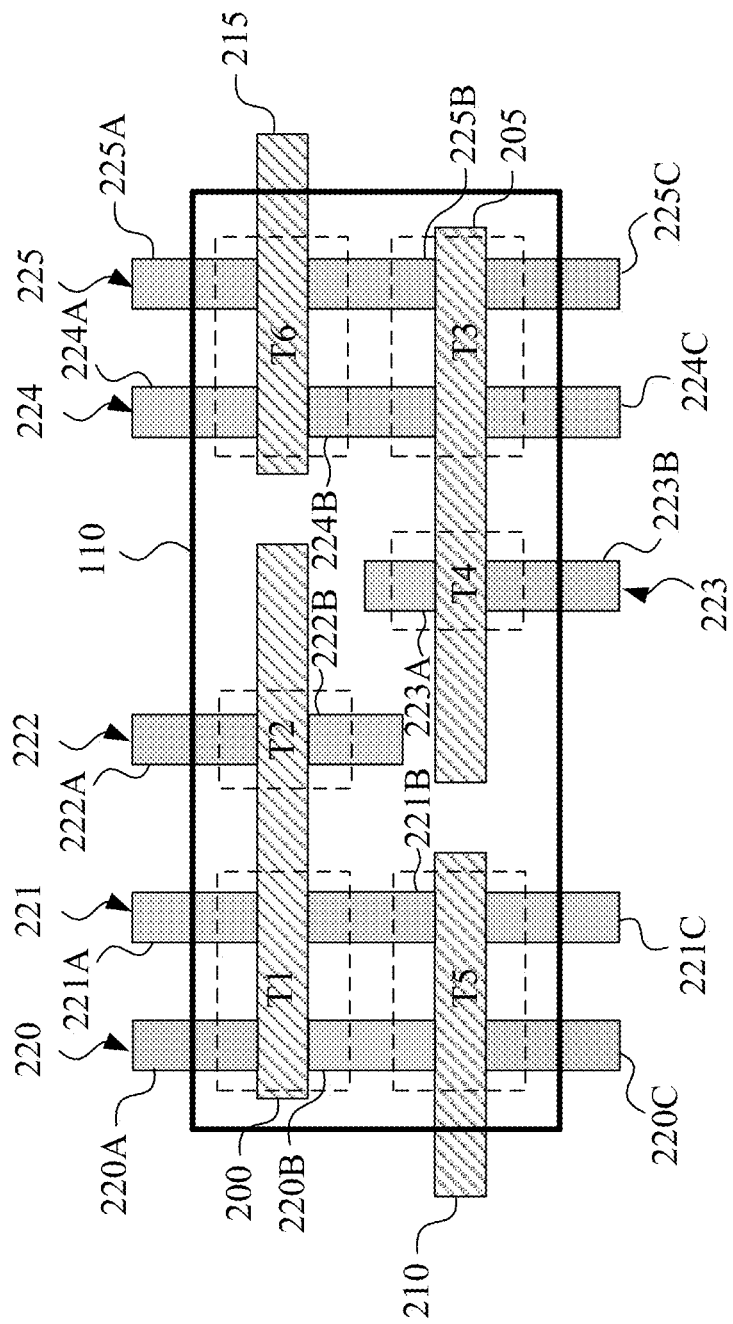
FIG. 2B is an exemplary layout diagram of the memory bit cell corresponding to that in FIG. 2A, without any interconnection, in accordance with various embodiments of the present disclosure.

FIG. 2B is an exemplary layout diagram of the memory bit cell 110 corresponding to that in FIG. 2A, without any interconnection, in accordance with various embodiments of the present disclosure. With respect to the embodiments of FIG. 2A, like elements in FIG. 2B are designated with the same reference numbers for ease of understanding.

Components of the memory bit cell 110 in FIG. 2B, as will be illustrated below, are disposed, in some embodiments, over a semiconductor substrate, which, for convenience of illustration, is not shown in FIG. 2B. In some embodiments, the semiconductor substrate is a silicon substrate or other suitable semiconductor substrate.

For illustration in FIG. 2B, each of the transistors T1-T6 of the memory bit cell 110 is illustrated within a dashed line frame. The memory bit cell 110 includes gate electrodes 200, 205, 210 and 215 arranged to form gates of the transistors T1-T6. Various conductive materials used to form the gates of the transistors T1-T6 are within the contemplated scope of the present disclosure. For example, in various embodiments, the gates of the transistors T1-T6 are formed of metals, metal alloys, metal silicides, or the like.

In some embodiments, the memory bit cell 110 further includes fin structures 220-225. The fin structures 220-225 are arranged as active regions of the semiconductor substrate, and are arranged to form sources/drains of the transistors T1-T6 after epitaxy. The term "source/drain" is referred to as a region that is either a source region or a drain region, in the present disclosure.

The number and the configuration of the fin structures in each of the transistors T1-T6 in FIG. 2B are given for illustrative purposes. Various numbers and configurations of the fin structures in each of the transistors T1-T6 are within the contemplated scope of the present disclosure.

For illustration, the fin structure 220 includes fin sections 220A-220C and the fin structure 221 includes fin sections 221A-221C. The fin sections 220A and 221A correspond to the first source/drain of the transistor T1, and the fin sections 220B and 221B correspond to the second source/drain of the transistor T1. Alternatively stated, the fin sections 220A and 221A, the gate electrode 200 and the fin sections 220B and 221B together correspond to the transistor T1.

The fin sections 220B and 221B also correspond to the first source/drain of the transistor T5, and the fin sections 220C and 221C correspond to the second source/drain of the transistor T5. Alternatively stated, the fin sections 220B and 221B, the gate electrode 210 and the fin sections 220C and 221C together correspond to the transistor T5.

The fin structure 222 includes fin sections 222A-222B. The fin section 222A corresponds to the first source/drain of the transistor T2 and the fin section 222B corresponds to the second source/drain of the transistor T2. Alternatively stated, the fin section 222A, the gate electrode 200 and the fin sections 222B together correspond to the transistor T2.

The fin structure 223 includes fin sections 223A-223B. The fin section 223A corresponds to the second source/drain of the transistor T4 and the fin section 223B corresponds to the first source/drain of the transistor T4. Alternatively stated, the fin section 223A, the gate electrode 205, and the fin sections 223B together correspond to the transistor T4.

The fin structure 224 includes fin sections 224A-224C, and the fin structure 225 includes fin sections 225A-225C. The fin sections 224A and 225A correspond to the second source/drain of the transistor T6, and the fin sections 224B and 225B correspond to the first source/drain of the transistor T6. Alternatively stated, the fin sections 224A and 225A, the gate electrode 215, and the fin sections 224B and 225B together correspond to the transistor T6.

The fin sections 224B and 225B also correspond to the second source/drain of the transistor T3, and the fin sections 224C and 225C correspond to the first source/drain of the transistor T3. Alternatively stated, the fin sections 224B and 225B, the gate electrode 205 and the fin sections 224C and 225C together correspond to the transistor T3.

Figure 2C:
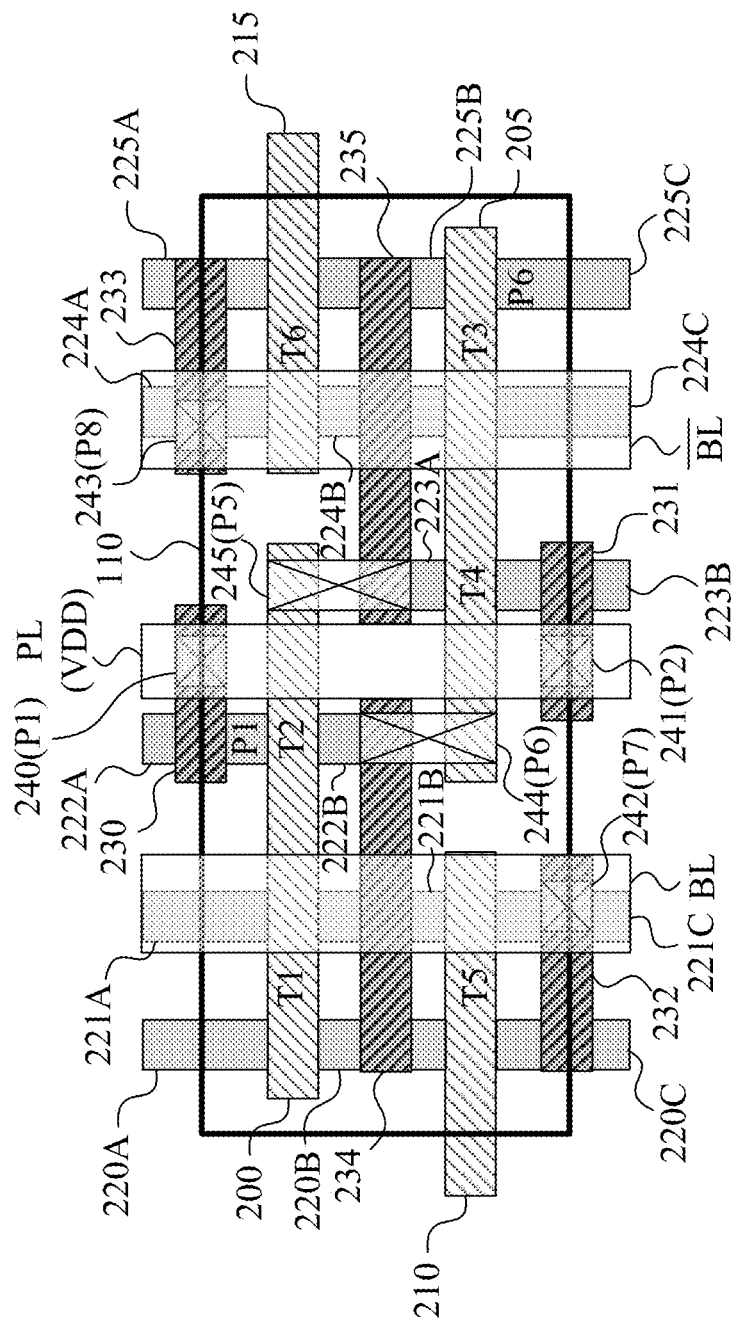
FIG. 2C is an exemplary layout diagram of the memory bit cell in FIG. 2B with interconnections coupled to the power supply and the bit lines in accordance with various embodiments of the present disclosure.

FIG. 2C is an exemplary layout diagram of the memory bit cell 110 in FIG. 2B with interconnections coupled to the power supply VDD and the bit lines BL and $\overline{BL}$ in accordance with various embodiments of the present disclosure. With respect to the embodiments of FIG. 2A, like elements in FIG. 2C are designated with the same reference numbers for ease of understanding. As illustrated in FIG. 2C, for simplicity, the transistors T1-T6 of the memory bit cell 110 are only labeled as T1-T6 at the respective gate electrode, without the dashed line frame.

The interconnections includes local interconnections 230-235 and contacts 240-245. In some embodiments, the local interconnections 230-235 and contacts 240-245 are formed of metals or the like. Various conductive materials used to form the local interconnections 230-235 and contacts 240-245 are within the contemplated scope of the present disclosure.

For illustration in FIG. 2C, the local interconnection 230 electrically couples the fin section 222A, which corresponds to the first source/drain of the transistor T2. The contact 240 (indicating the connection point P1) further electrically couples the local interconnection 230 to a metal line PL. The local interconnection 231 electrically couples the fin section 223B, which corresponds to the first source/drain of the transistor T4. The contact 241 (indicating the connection point P2) further electrically couples the local interconnection 231 to the metal line PL. In some embodiments, the metal line PL is configured to receive the voltage of the power supply VDD and provide the voltage of the power supply VDD to the transistors T2 and T4.

The local interconnection 232 electrically couples the fin sections 220C and 221C, which corresponds to the second source/drain of the transistor T5. The contact 242 (indicating the connection point P7) further electrically couples the local interconnection 232 to a metal line arranged to operate as the bit line BL. The local interconnection 233 electrically couples the fin sections 224A and 225A, which correspond to the second source/drain of the transistor T6. The contact 243 (indicating the connection point P8) further electrically couples the local interconnection 233 to a metal line arranged to operate as the bit line $\overline{BL}$.

The local interconnection 234 electrically couples the fin sections 220B, 221B and 222B. The fin sections 220B and 221B correspond to the second source/drain of the transistor T1 and the first source/drain of the transistor T5. The fin section 222B corresponds to the second source/drain of the transistor T2. The contact 244 (indicating the connection point P6) further electrically couples the local interconnection 234 to the gate electrode 205 corresponding to the gates of the transistors T4 and T3.

The local interconnection 235 electrically couples the fin sections 224B, 225B and 223A. The fin sections 224B and 225B correspond to the first source/drain of the transistor T6 and the second source/drain of the transistor T3. The fin section 223A corresponds to the second source/drain of the transistor T4. The contact 245 (indicating the connection point P5) further electrically couples the local interconnection 235 to the gate electrode 200 corresponding to the gates of the transistors T2 and T1.

In some embodiments, the metal line PL, the bit line BL and the bit line $\overline{BL}$ are formed within a metal one (M1) layer.

Figure 2D:
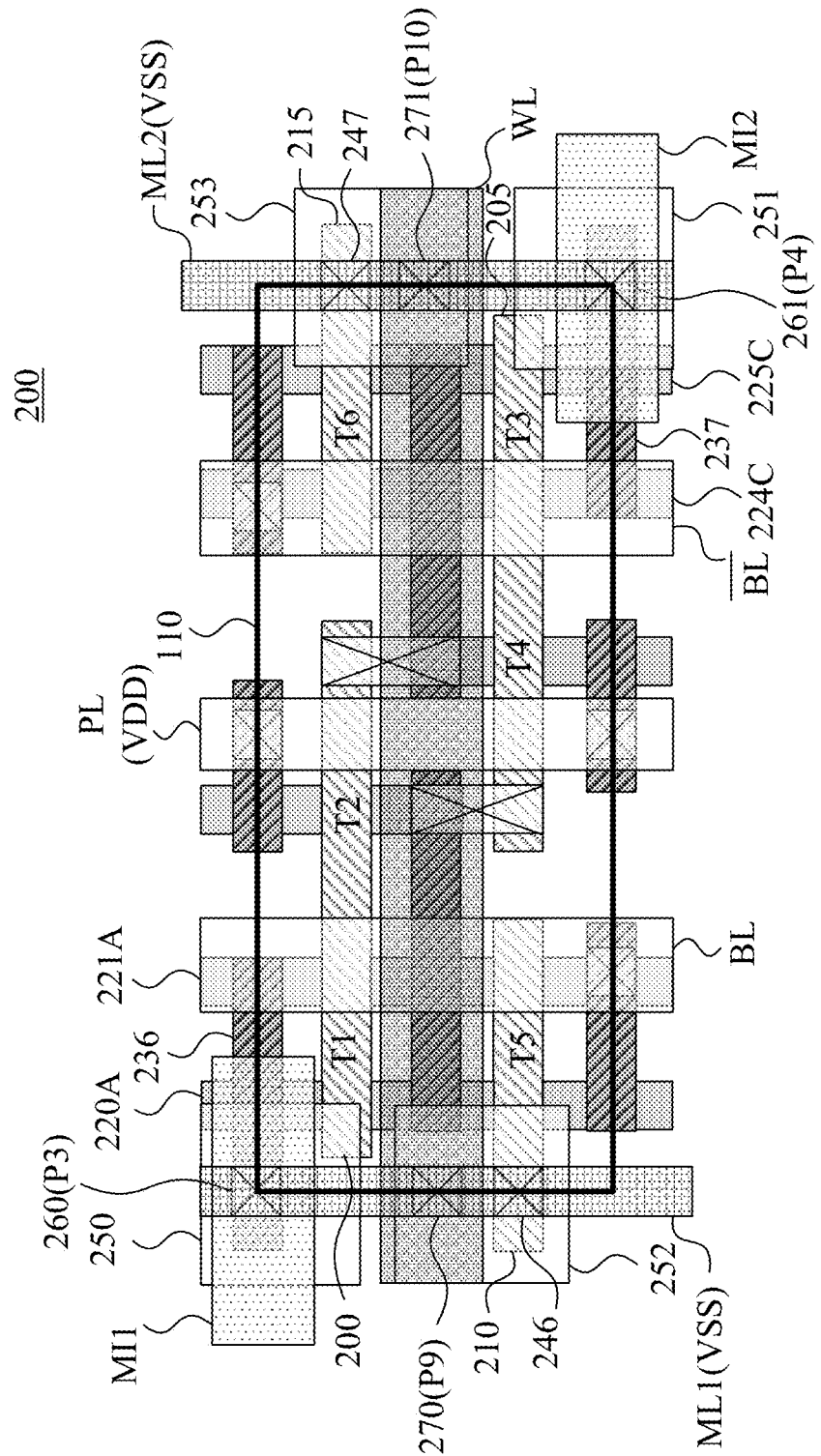
FIG. 2D is an exemplary layout diagram of the memory device in FIG. 2A, that includes the memory bit cell in FIG. 2C with additional interconnections coupled to the power supply through connection metal lines and the metal islands and to the word line, in accordance with various embodiments of the present disclosure.

FIG. 2D is an exemplary layout diagram of the memory device 200 in FIG. 2A, that includes the memory bit cell 110 in FIG. 2C with additional interconnections coupled to the power supply VSS through connection metal lines ML1 and ML2 and metal islands MI1 and MI2 and to the word line WL, in accordance with various embodiments of the present disclosure. With respect to the embodiments of FIG. 2A, like elements in FIG. 2D are designated with the same reference numbers for ease of understanding.

Figure 2E:
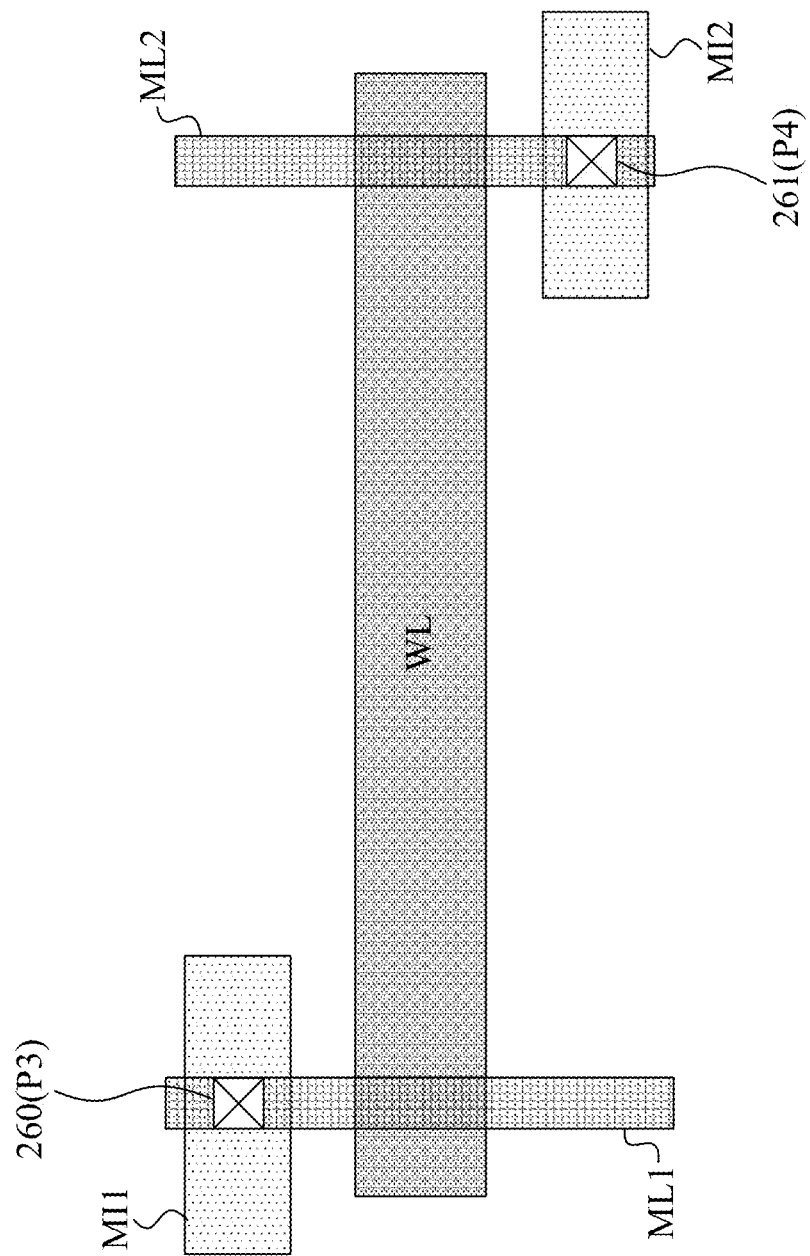
FIG. 2E is a partial layout diagram of the memory device in FIG. 2D in accordance with various embodiments of the present disclosure.

FIG. 2E is a partial layout diagram of the memory device 200 in FIG. 2D in accordance with various embodiments of the present disclosure. For simplicity, in FIG. 2E, only the word line WL, the metal islands MI1 and MI2 and the connection metal lines ML1 and ML2 are illustrated.

With respect to the embodiments of FIG. 2D, like elements in FIG. 2E are designated with the same reference numbers for ease of understanding. For ease of understanding, the layout diagram of the memory device 200 is discussed below with reference to FIG. 2D and FIG. 2E.

For illustration in FIG. 2D, the numeral labels unrelated to the additional interconnections are not illustrated, for ease of understanding. The additional interconnections include local interconnections 236-237, metal segments 250-253, contacts 246-247, vias 260-261 and vias 270-271. In some embodiments, the additional interconnections above are formed of metals or the like. Various conductive materials used to form the interconnections mentioned above are within the contemplated scope of the present disclosure.

The contact 246 electrically couples the gate electrode 210, which corresponds to the gate of the transistor T5, to the metal segment 252. Moreover, the via 270 (indicating the connection point P9) electrically couples the metal segment 252 to the word line WL. The contact 247 electrically couples the gate electrode 215, which corresponds to the gate of the transistor T6, to the metal segment 253. Moreover, the via 271 (indicating the connection point P10) electrically couples the metal segment 253 to the word line WL.

In some embodiment, the metal segments 252 and 253 are formed within the metal one (M1) layer. In some embodiment, the metal segments 252 and 253 are configured to receive driving signals (not illustrated) to drive the word line WL. In some embodiment, the word line WL is formed within a metal two (M2) layer different from the metal one (M1) layer. For illustration, the word line WL extends along a direction that defines a row in FIG. 1.

The connection metal line ML1 is electrically coupled through a via 260 (indicating the connection point P3) to the metal island MI1, as shown in FIG. 2E. The local interconnection 236 electrically couple the fin sections 220A and 221A, which correspond to the first source/drain of the transistor T1, to the connection metal line ML1 through a first via (not shown), the metal segment 250 and a second via (not shown), in some embodiments. For illustration, the power supply VSS is received by the connection metal line ML1 and further to the metal island MI1 and the fin sections 220A and 221A.

The connection metal line ML2 is electrically coupled through a via 261 (indicating the connection point P4) to the metal island MI2, as shown in FIG. 2E. The local interconnection 237 electrically couple the fin sections 224C and 225C, which correspond to the first source/drain of the transistor T3, to the connection metal line ML2 through a third via (not shown), the metal segment 251 and a fourth via (not shown), in some embodiments. For illustration, the power supply VSS is received by the connection metal lines ML2 and further to the metal island MI2 and the fin sections 224C and 225C.

In some embodiments, the metal island MI1 corresponding to one specific memory bit cell 110 is shared with another memory bit cell 110 in, for illustration, a left column next to the specific memory bit cell 110. Furthermore, the metal island MI2 corresponding to one specific memory bit cell 110 is shared with another memory bit cell 110 in, for illustration, a right column next to the specific memory bit cell 110.

In some embodiments, the length of each one of the metal islands MI1 and MI2 is shorter than a half of the length of the memory bit cell 110. For a numerical example, the length of each of the metal islands MI1 and MI2 ranges from about 0.2 to about 0.4 times the length of the memory bit cell 110. In some other embodiments, the length of each of the metal islands MI1 and MI2 ranges from about 0.4 to about 0.7 times the width of the memory bit cell 110. In some embodiments, the width of the word line WL ranges from about 1 to about 2 times the length of each of the metal islands MI1 and MI2.

In some embodiments, the metal islands MI1 and MI2 are formed in the metal two (M2) layer at opposite sides of the word line WL, as illustrated in FIG. 2E.

In some embodiments, the connection metal line ML1 and ML2 are disposed in a metal three (M3) layer different from the metal one (M1) layer and the metal two (M2) layer. In some embodiments, in a top-down sequence, the metal three (M3) layer is formed on the metal two (M2) layer, and the metal two (M2) layer is formed on the metal one (M1) layer.

In some embodiments, the voltage of the power supply VSS is smaller than the voltage of the power supply VDD. In some embodiments, the voltage of the power supply VSS is a ground voltage. The relation of the voltages of the power supply VSS and the power supply VDD is given for illustrative purposes. Various relations of the voltages of the power supply VSS and the power supply VDD are within the contemplated scope of the present disclosure.

In some approaches, power lines are electrically coupled to the power supply VSS to provide the voltage of the power supply VSS to the memory bit cell. The power lines are disposed in the metal layer M2 to extend along the direction in parallel and next to the word line WL.

The capacitance between metal lines, including, for example, the word line WL and the power lines, of the same metal layer, are referred to as inter-wire capacitance or coupling capacitance. Such a capacitance may raise issues in deep submicron technologies because of relatively tighter pitch and relatively higher metal aspect ratios. For example, the signals transmitted on the word line WL and the power lines are affected by the coupling capacitance. The accuracy and the speed of the read and write operations are impacted because of the coupling effect between the metal lines.

Compared to the approaches discussed above, by employing the metal islands MI1 and MI2 illustrated in the present disclosure, small fragments of metal lines are disposed next to the word line WL. No lengthy metal line is required to extend along with the word line WL. Further, since the length of each of the metal islands MI1 and MI2 is shorter than that in related approaches, the coupling effect between the metal islands MI1 and MI2 and the word line WL is decreased. As a result, the accuracy and the speed of the read and write operations of the memory device 200 are higher compared to other approaches discussed above.

Figure 3A:
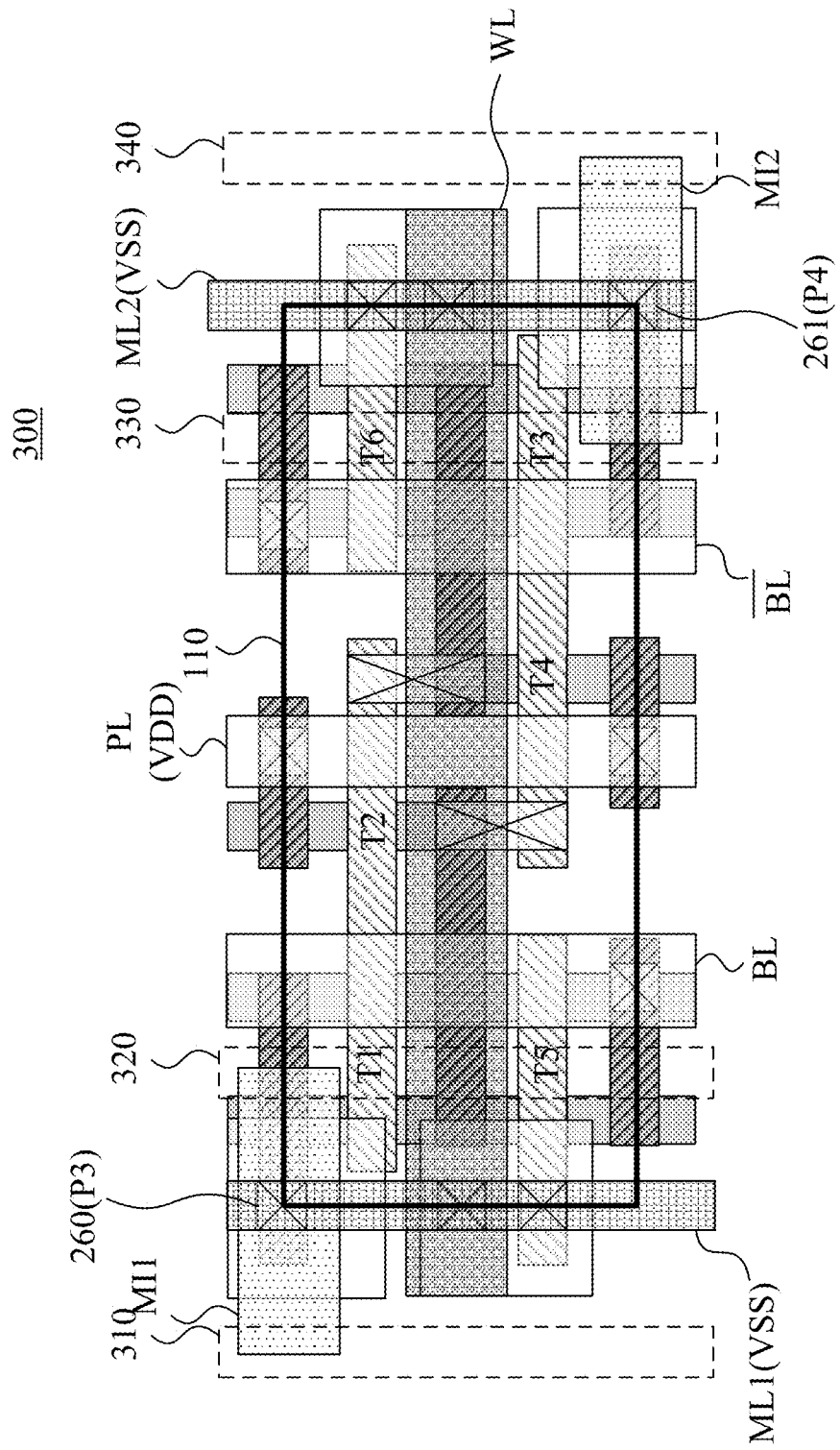
FIG. 3A is an exemplary layout diagram of a memory device in accordance with various embodiments of the present disclosure.
Figure 3B:
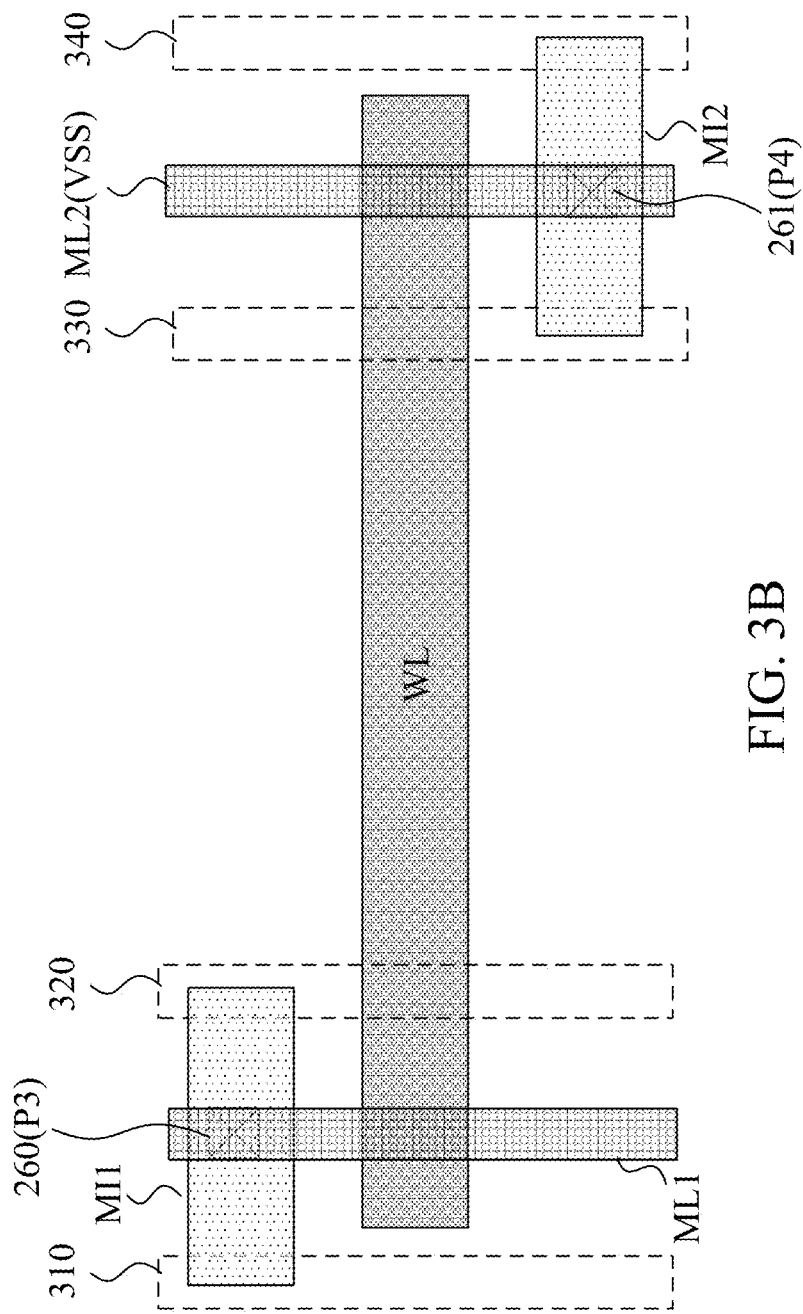
FIG. 3B is a partial layout diagram of the memory device in FIG. 3A in accordance with various embodiments of the present disclosure.

FIG. 3A is an exemplary layout diagram of a memory device 300 in accordance with various embodiments of the present disclosure. FIG. 3B is a partial layout diagram of the memory device 300 in FIG. 3A in accordance with various embodiments of the present disclosure.

Similar to the memory device 200 illustrated in FIG. 2D, the memory device 300 includes the memory bit cell 110, the bit lines BL and $\overline{BL}$, the word line WL, the power line PL, the metal islands MI1 and MI2 and the connection metal lines ML1 and ML2.

Compared to FIG. 2D, the memory device 300 in FIG. 3A includes cut metals 310, 320, 330 and 340. For simplicity, in FIG. 3B, only the word line WL, the metal islands MI1 and MI2, the connection metal lines ML1 and ML2 and the cut metals 310, 320, 330 and 340 are illustrated.

For illustration, the cut metals 310 and 320 are formed at two sides of the metal island MI1. Moreover, the cut metals 310 and 320 partially cover the two sides of the metal island MI1.

The cut metals 330 and 340 are formed at two sides of the metal island MI2. Moreover, the cut metals 330 and 340 partially cover the two sides of the metal island MI2.

A cutting process is further performed on the two sides of each of the metal islands MI1 and MI2 covered by the cut metals 310, 320, 330 and 340 respectively.

By employing the cutting process based on the formation of the cut metals 310, 320, 330 and 340, the length of each of the metal islands MI1 and MI2 is further decreased. The coupling effect between the metal islands MI1 and MI2 and the word line WL is further decreased accordingly. As a result, the accuracy and the speed of the read and write operations of the memory device 300 are further improved.

Figure 4A:
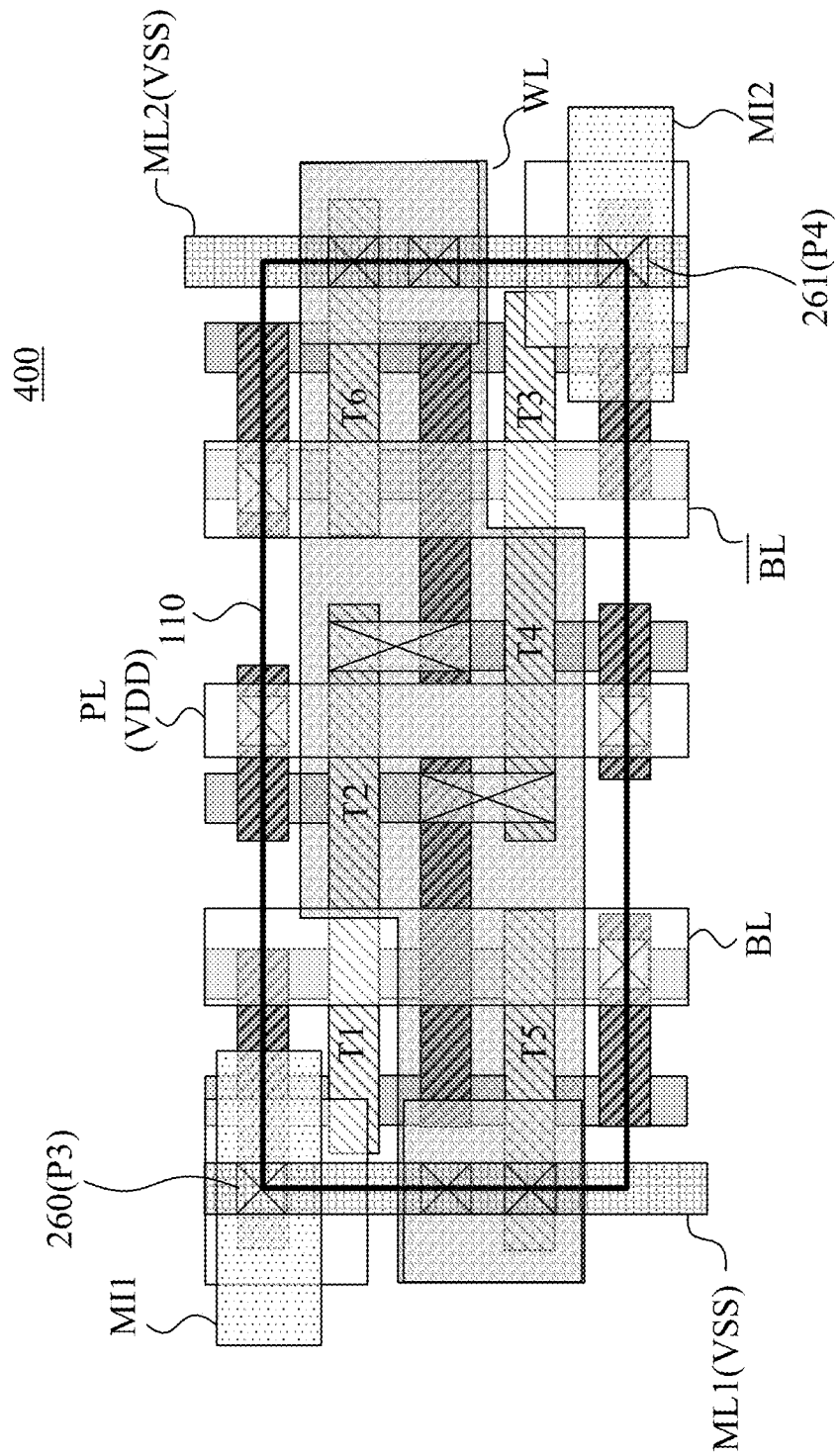
FIG. 4A is an exemplary layout diagram of a memory device in accordance with various embodiments of the present disclosure.
Figure 4B:
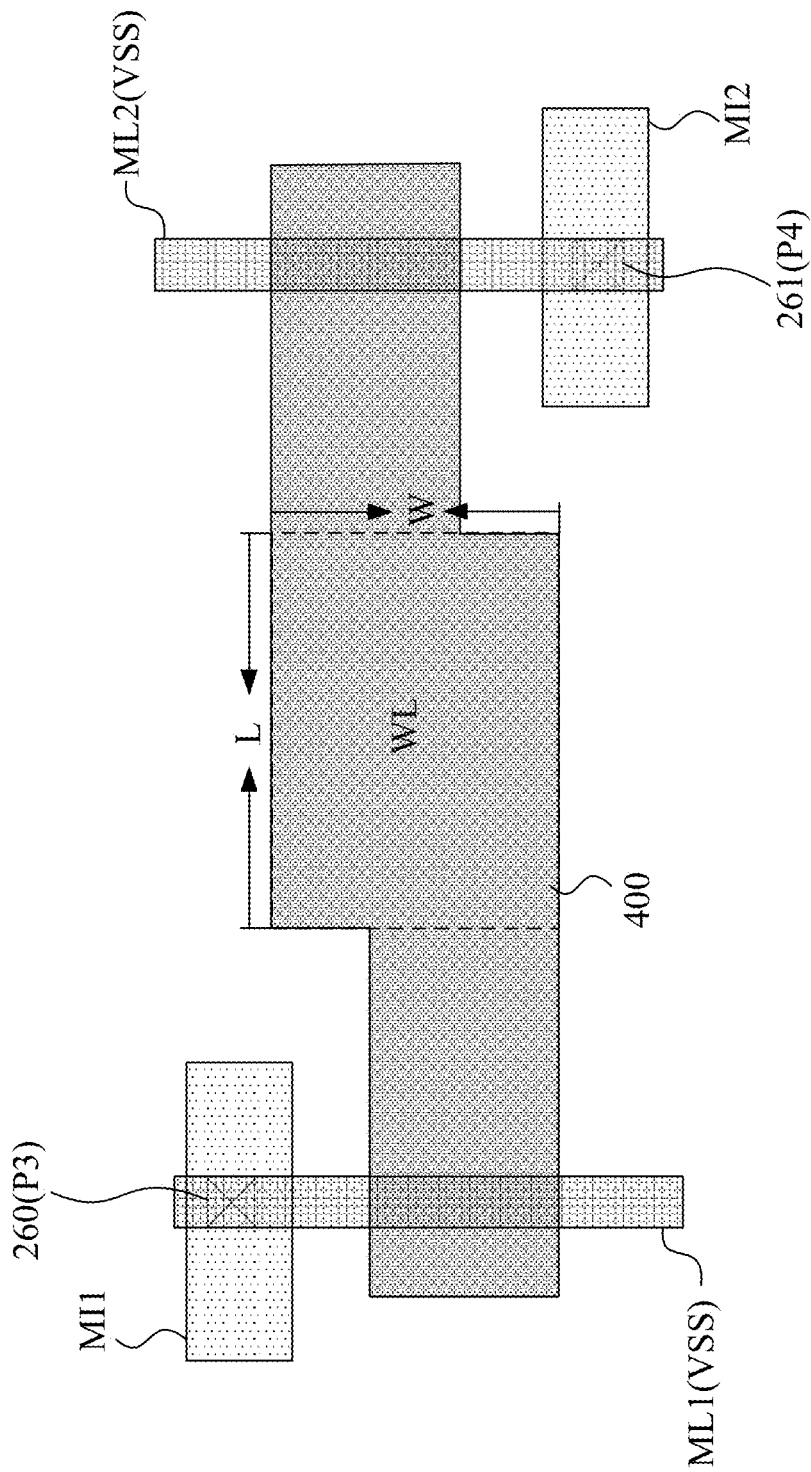
FIG. 4B is a partial layout diagram of the memory device in FIG. 4A in accordance with various embodiments of the present disclosure.

FIG. 4A is an exemplary layout diagram of a memory device 400 in accordance with various embodiments of the present disclosure. FIG. 4B is a partial layout diagram of the memory device 400 in FIG. 4A in accordance with various embodiments of the present disclosure.

Similar to the memory device 200 illustrated in FIG. 2D, the memory device 400 includes the memory bit cell 110, the bit lines BL and $\overline{BL}$, the word line WL, the power line PL, the metal islands MI1 and MI2 and the connection metal lines ML1 and ML2.

Compared to FIG. 2D, the word line WL of the memory device 400 in FIG. 4A includes a zigzag shape. For simplicity, in FIG. 4B, only the word line WL, the metal islands MI1 and MI2 and the connection metal lines ML1 and ML2 are illustrated.

For illustration in FIG. 4B, the word line WL having the zigzag shape includes a portion 400 having a width W and a length L, in which the width W is the largest width of the word line WL. In some embodiments, the length L of the portion 400 is sandwiched between the metal islands MI1 and MI2. The portion 400 is configured to fill the space between the metal islands MI1 and MI2 as much as possible to obtain a larger line width. In some embodiments, the word line WL having the zigzag shape has the width which ranges from about 1.1 to about 1.5 times the width of the metal islands MI1 and MI2. In some other embodiments, the largest width of the word line WL ranges from about 1.5 to about 3 times the width of the metal islands MI1 and MI2, and the smallest width of the word line WL ranges from about 1 to about 2.5 times the width of the metal islands MI1 and MI2.

In some embodiments, the word line WL having the zigzag shape may have an even larger width. However, under such a condition, the wide word line WL results in larger area of the memory device, which is undesirable.

When the width of the word line WL is wider, the electrons are easier to flow through the metal line. Accordingly, a wider width of the word line WL results in a smaller resistance.

The coupling effect between the word line WL and the metal islands MI1 and MI2 disposed next to the word line WL not only relates to the inter-wire coupling capacitance, but also the resistance of the word line WL and the metal islands MI1 and MI2. As a result, the word line WL of a zigzag shape having a wider length further reduces the coupling effect. The accuracy and the speed of the read and write operations of the memory device 400 are further improved.

The device of claim 4, further comprising a second word line disposed in a fourth metal layer that fully covers the first word line and electrically coupled to the first word line.

Figure 5A:
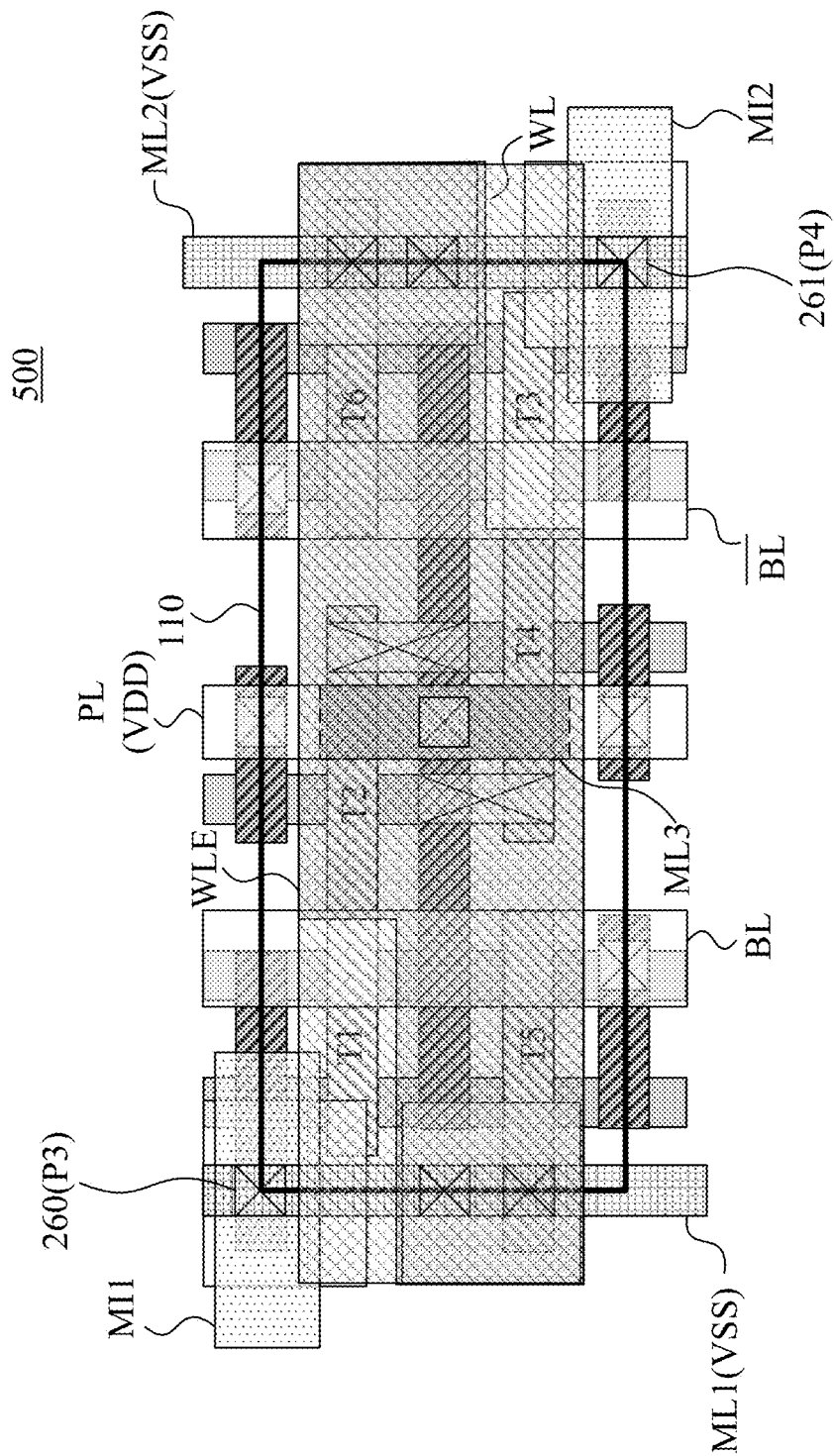
FIG. 5A is an exemplary layout diagram of a memory device in accordance with various embodiments of the present disclosure.
Figure 5B:
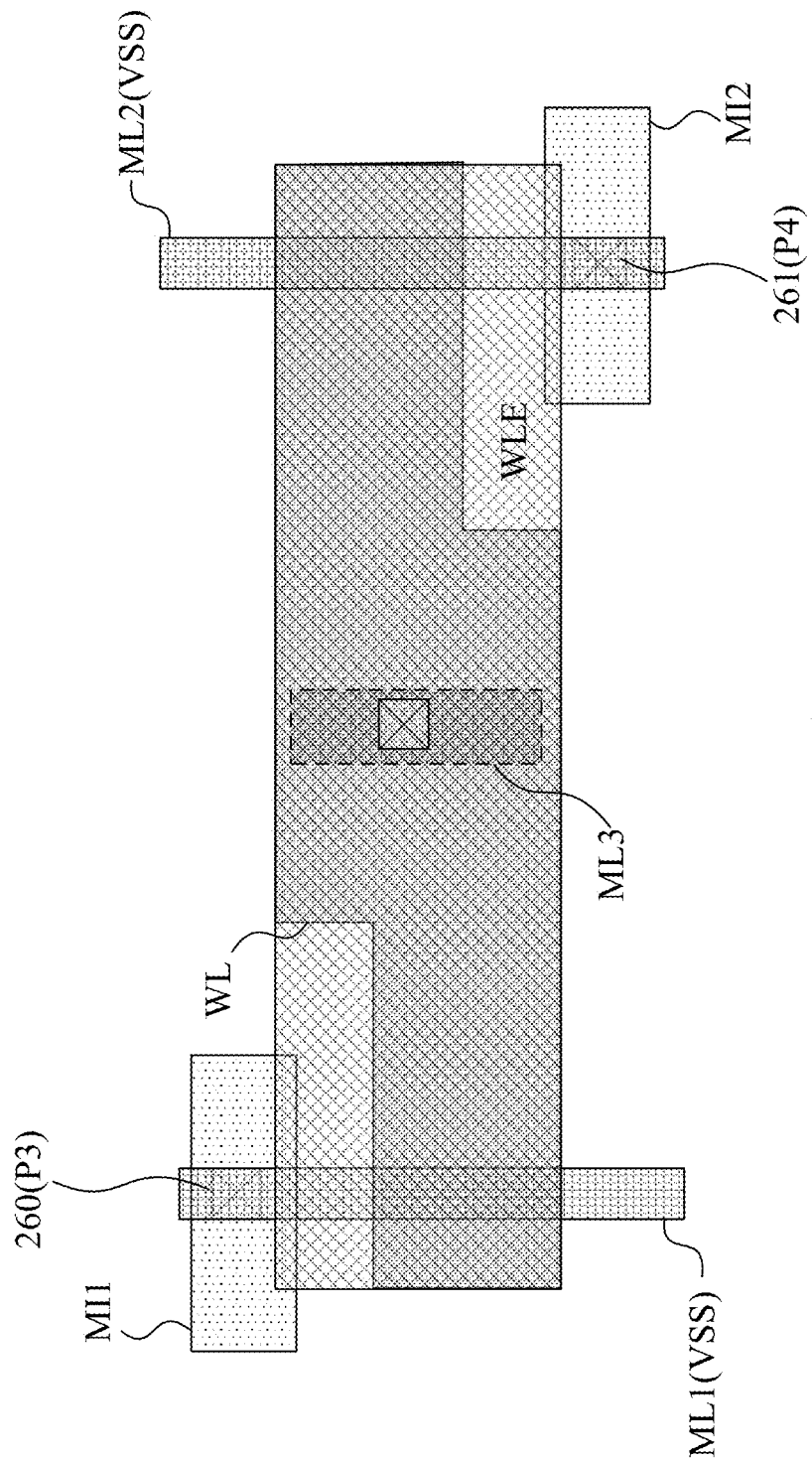
FIG. 5B is a partial layout diagram of the memory device in FIG. 5A in accordance with various embodiments of the present disclosure.

FIG. 5A is an exemplary layout diagram of a memory device 500 in accordance with various embodiments of the present disclosure. FIG. 5B is a partial layout diagram of the memory device 500 in FIG. 5A in accordance with various embodiments of the present disclosure.

Similar to the memory device 400 illustrated in FIG. 5A, the memory device 500 includes the memory bit cell 110, the bit lines BL and $\overline{BL}$, the word line WL having the zigzag shape, the power line PL, the metal islands MI1 and MI2 and the connection metal lines ML1 and ML2.

Compared to FIG. 4A, the memory device 500 in FIG. 5A further includes a word line WLE. For simplicity, in FIG. 5B, only the word line WL, the word line WLE, the metal islands MI1 and MI2 and the connection metal lines ML1 and ML2 are illustrated.

The word line WLE is disposed in a metal layer M4 different from the metal layers M1, M2 and M3. In some embodiments, the word line WLE fully covers the word line WL and is electrically coupled to the word line WL. In some embodiments, the word line WLE is electrically coupled to the word line WL through a metal line ML3 in metal layer M3. As a result, the word line WLE is actually a part of the word line WL.

In some embodiments, in a top-down sequence, the word line WLE is vertically overlapped with a portion of the metal island MI1 and a portion of the metal island MI2. In some embodiments, in a top-down sequence, the word line WLE is disposed over the gate electrodes 200, 205, 210 and 215 illustrated in FIG. 2C.

For illustration, the presence of the word line WLE increases the width of the word line WL. Since the word line WLE is disposed in the metal layer M4 different from the metal layer 2, the word line WLE with the larger width does not occupy the space that the metal islands MI1 and MI2 locate.

As described above, when the total width of the word line, including the word line WL and the word line WLE, is wider, the electrons are easier to flow through the metal line. Accordingly, the formation of the word line WL having the zigzag shape and the word line WLE results in a smaller resistance.

The coupling effect between the word lines WL and WLE and the metal islands MI1 and MI2 disposed next to the word line WL not only relates to the inter-wire coupling capacitance, but also the resistance of the word lines WL and WLE and the metal islands MI1 and MI2. As a result, the formation of the word line WL and the word line WLE having a wider length further reduces the coupling effect. The accuracy and the speed of the read and write operations of the memory device 500 are further improved.

Figure 6A:
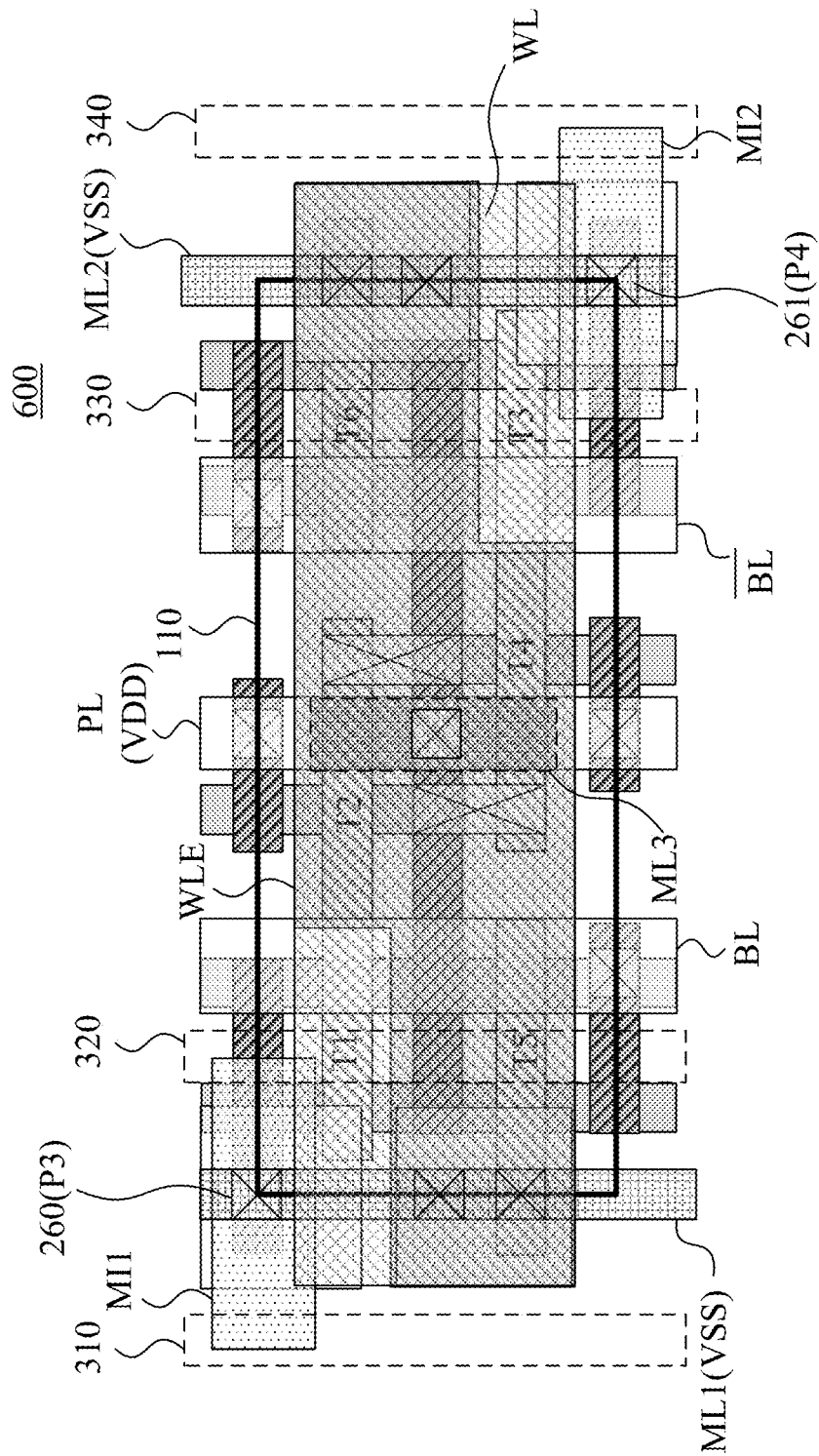
FIG. 6A is an exemplary layout diagram of a memory device in accordance with various embodiments of the present disclosure.
Figure 6B:
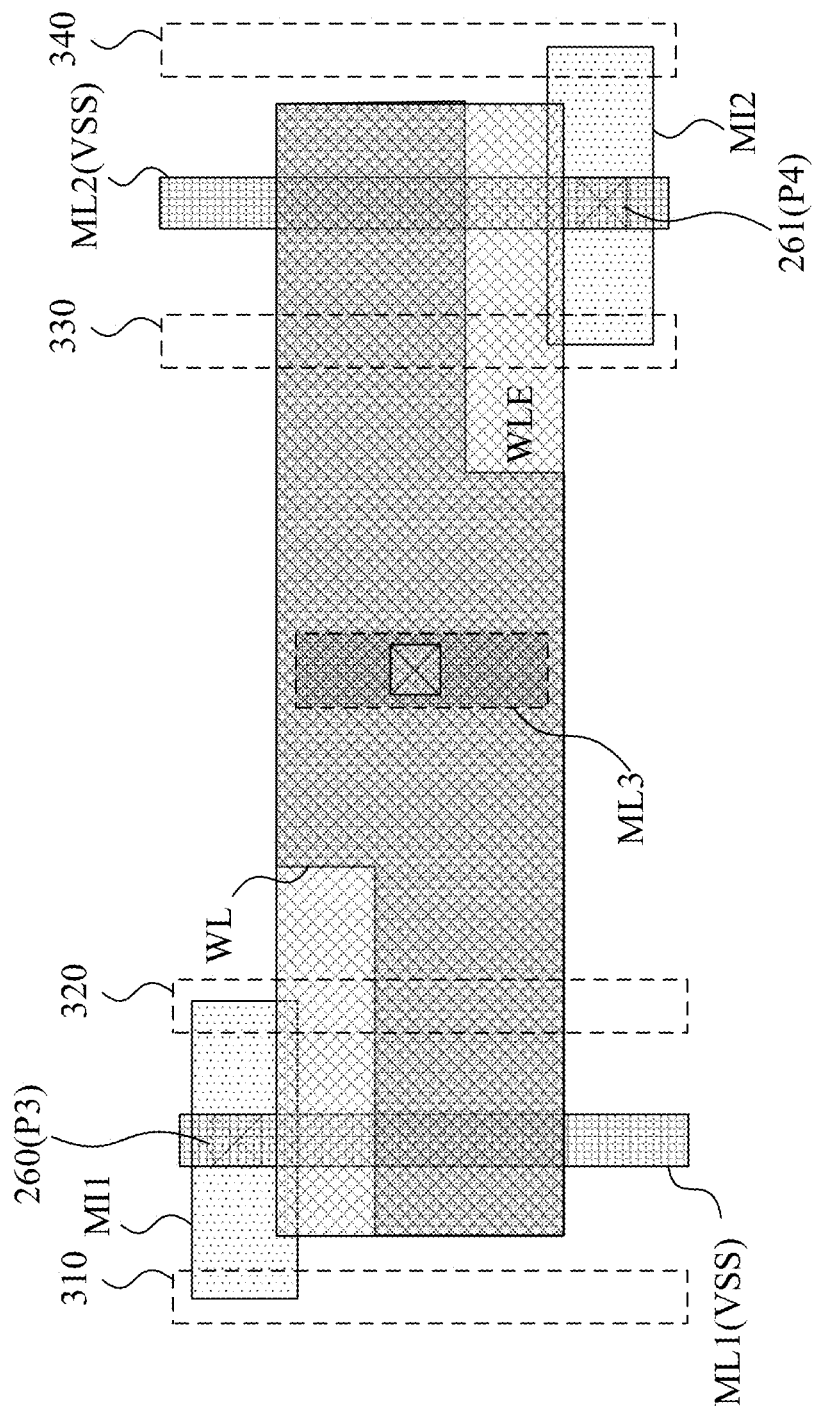
FIG. 6B is a partial layout diagram of the memory device in FIG. 6A in accordance with various embodiments of the present disclosure.

FIG. 6A is an exemplary layout diagram of a memory device 600 in accordance with various embodiments of the present disclosure. FIG. 6B is a partial layout diagram of the memory device 600 in FIG. 6A in accordance with various embodiments of the present disclosure.

Similar to the memory device 200 illustrated in FIG. 2D, the memory device 600 includes the memory bit cell 110, the bit lines BL and $\overline{BL}$, the word line WL, the power line PL, the metal islands MI1 and MI2 and the connection metal lines ML1 and ML2.

Compared to FIG. 2D, the memory device 600 in FIG. 6A further includes all the features mentioned above and thus includes the cut metal 310, 320, 330 and 340 formed for the cutting process illustrated in FIG. 3A, the word line WL with the zigzag shape illustrated in FIG. 4A and the word line WLE disposed at the metal layer M4 illustrated in FIG. 5A. For simplicity, in FIG. 6B, only the word line WL, the word line WLE, the metal islands MI1 and MI2, the connection metal lines ML1 and ML2 and the cut metal 310, 320, 330 and 340 are illustrated.

With the disposition of the metal islands MI1 and MI2, the cutting process performed on the metal islands MI1 and MI2 and the wider width of the word line WL and the word line WLE, a smaller inter-wire capacitance and a smaller resistance of the word line are obtained. Accordingly, the coupling effect between the word lines WL and WLE and the metal islands MI1 and MI2 is reduced. As a result, the accuracy and the speed of the read and write operations of the memory device 400 are further improved.

Figure 7:
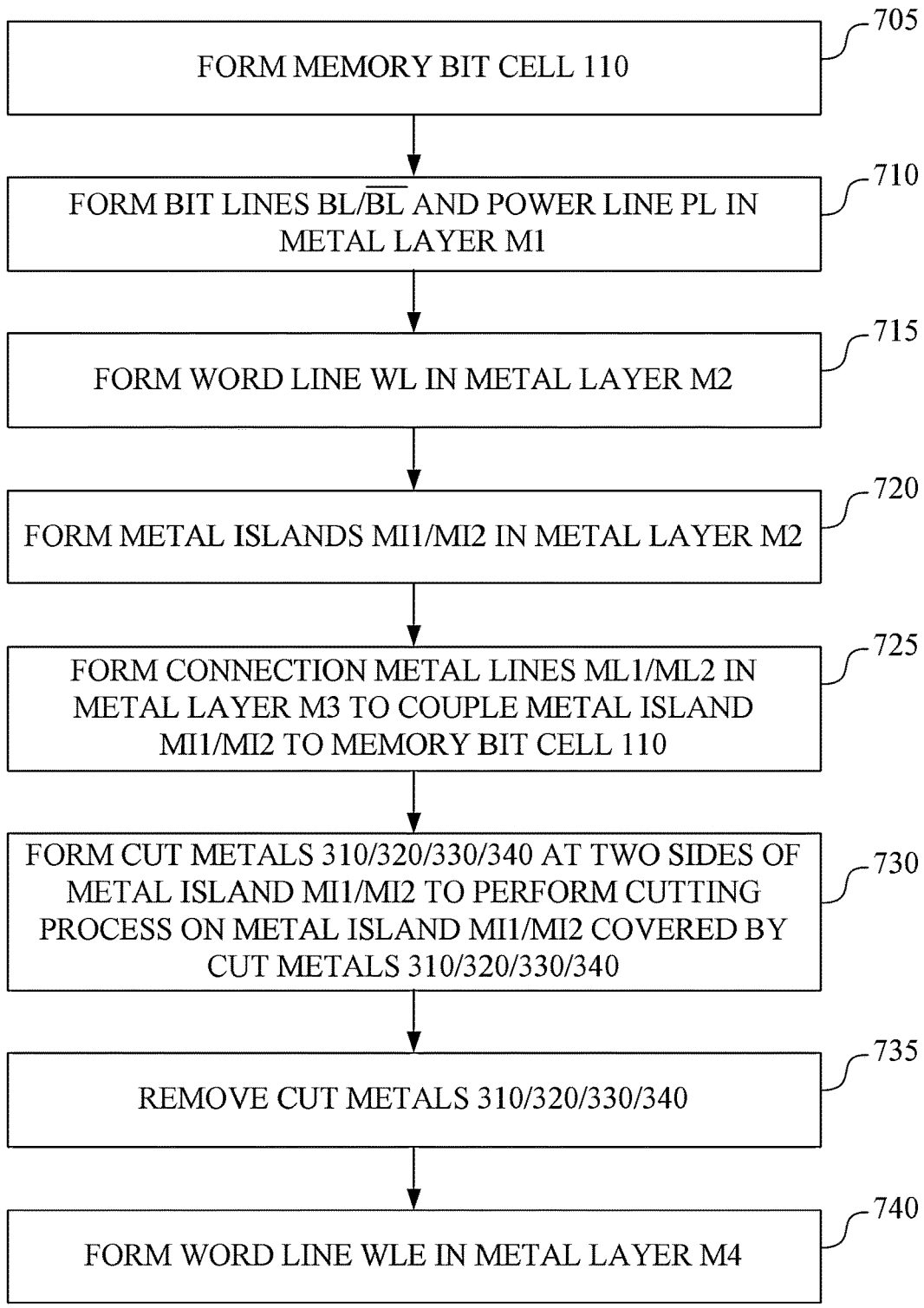
FIG. 7 is a flow chart of a method illustrating the fabrication process of the memory device in FIG. 6A, in accordance with some embodiments of the present disclosure.

FIG. 7 is a flow chart of a method 700 illustrating the fabrication process of the memory device 600 in FIG. 6A, in accordance with some embodiments of the present disclosure.

With reference to the method 700 in FIG. 7 and the memory device 600 in FIG. 6A, in operation 705, the memory bit cell 110 is formed. In some embodiments, the memory bit cell 110 is a six-transistor (6T) cell that includes the transistors T1-T6.

In operation 710, the bit lines BL and $\overline{BL}$ and the power line PL electrically coupled to the memory bit cell 110 are formed in the metal layer M1.

In some embodiments, the bit lines BL and $\overline{BL}$ extend along the column direction. For illustration, the bit lines BL is electrically coupled to the transistor T5 of the memory bit cell 110. The bit line $\overline{BL}$ is electrically coupled to the transistor T6 of the memory bit cell 110. More specifically, the bit line BL is electrically coupled to the source/drain terminal of the transistor T5. The bit line $\overline{BL}$ is electrically coupled to the source/drain terminal of the transistor T6.

The power line PL is disposed in the metal layer M1 and is electrically coupled to the power supply VDD. The power line PL is further electrically coupled to the transistors T2 and T4 of the memory bit cell 110 to provide the voltage of the power supply VDD thereto.

In operation 715, the word line WL electrically coupled to the memory bit cell 110 is formed in the metal layer M2.

In some embodiments, the word line WL extends along the row direction different from the column direction. The word line WL is electrically coupled to the transistors T5 and T6 of the memory bit cell 100. More specifically, the word line WL is electrically coupled to gate terminals of the transistors T5 and T6 to control whether the cell should be connected to the bit lines BL and $\overline{BL}$. As a result, access to the memory bit cell 110 is enabled by the word line WL which controls the two access transistors T5 and T6 which, in turn, control whether the cell should be connected to the bit lines BL and $\overline{BL}$.

In operation 720, the metal islands MI1 and MI2 electrically coupled to the power supply VSS are formed at opposite sides of the word line WL in the metal layer M2.

In operation 725, the connection metal lines ML1 and ML2 electrically coupling the metal islands MI1 and MI2 to the memory bit cell 110 are respectively formed in the metal layer M3.

In some embodiments, the connection metal lines ML1 and ML2 are electrically coupled to the metal islands MI1 and MI2 through vias and are further electrically coupled to the transistors T1 and T3 through contacts. As a result, the metal islands MI1 and MI2 provide the voltage of the power supply VSS to the transistors T1 and T3.

In operation 730, the cut metals 310, 320, 330 and 340 are formed at two sides of the metal islands MI1 and MI2 respectively such that the cutting process is further performed on the two sides of each of the metal islands MI1 and MI2 covered by the cut metals 310, 320, 330 and 340 respectively.

In operation 735, the cut metals 310, 320, 330 and 340 are removed.

In operation 740, the word line WLE in the metal layer M4 that fully covers the word line WL and electrically coupled to the word line WL is formed.

The number and the order of the operations illustrated in FIG. 7 are given for illustrative purposes. Various numbers and the orders of the operations are within the contemplated scope of the present disclosure.

In some embodiments, a device is disclosed that includes a fin structure, a word line, a first metal island and a first connection metal line. The fin structure is disposed below a first metal layer, extending along a column direction, and corresponding to at least one transistor of a memory bit cell. The word line is disposed in the first metal layer and extending along a row direction. The first metal island is disposed in the first metal layer separated from the word line. The first connection metal line is disposed in a second metal layer above the first metal layer, extending along the column direction, and configured to couple a power supply through the first metal island to the fin structure. In a layout view, the first connection metal line is separated from the fin structure, and the fin structure crosses over the word line and the first metal island.

Also disclosed is a device is disclosed that includes fin structures of a memory bit cell that is coupled to a bit line, a pair of metal islands, a pair of metal lines and a first part and a second part of a word line. The pair of metal islands is disposed over the plurality of fin structures. The pair of metal lines is disposed over the fin structures and coupled through the pair of metal islands to at least one of the plurality of fin structures. The first part and a second part of a word line disposed over the plurality of fin structures and coupled to the memory bit cell. In a layout view, the pair of metal lines are separated from the fin structures and the bit line, and partially overlaps the pair of metal islands and the word line, and the first part of word line fully overlaps the second part of word line.

Also disclosed is a method that includes: forming a pair of metal islands extending along a first direction, wherein in a layout view, the pair of metal islands are partially overlapped with at least one of fin structures that extend along a second direction and are separated from a bit line that extend along the second direction; and forming a pair of connection metal lines extending along the second direction, that are separated from the bit line and the fin structures and cross over the pair of metal islands and a word line in a layout view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a fin structure disposed below a first metal layer, the fin structure extending along a column direction, and corresponding to at least one transistor of a memory bit cell;
   a word line disposed in the first metal layer and extending along a row direction;
   a first metal island disposed in the first metal layer separated from the word line; and
   a first connection metal line disposed in a second metal layer above the first metal layer, extending along the column direction, and configured to couple a power supply through the first metal island to the fin structure,
   wherein in a layout view, the first connection metal line is separated from the fin structure, and the fin structure crosses over the word line and the first metal island.

2. The device of claim 1, wherein the first metal island has a maximum width along the row direction, and the word line has a maximum width along the row direction, which is greater than the maximum width of the first metal island.

3. The device of claim 2, wherein the maximum width of the word line ranges from about 1.1 to about 1.5 times the maximum width of the first metal island.

4. The device of claim 2, wherein the maximum width of the first metal island ranges from about 0.2 to about 0.7 times a length of the memory bit cell in the row direction.

5. The device of claim 1, wherein the memory bit cell is disposed in a column of a memory array, and the first metal island is shared by the memory bit cell and a neighboring memory bit cell in a neighboring column of the memory array.

6. The device of claim 1, wherein the word line is arranged over the fin structure, and a gate of one of the at least one transistor is coupled to the word line.

7. The device of claim 1, wherein the word line comprises a zigzag shape.

8. A device, comprising:
   a plurality of fin structures of a memory bit cell that is coupled to a bit line;
   a pair of metal islands disposed over the plurality of fin structures;
   a pair of metal lines disposed over the plurality of fin structures and coupled through the pair of metal islands to at least one of the plurality of fin structures; and
   a first part and a second part of a word line disposed over the plurality of fin structures and coupled to the memory bit cell,
   wherein in a layout view,
   the pair of metal lines are separated from the plurality of fin structures and the bit line, and partially overlaps the pair of metal islands and the word line, and
   the first part of word line fully overlaps the second part of word line.

9. The device of claim 8, wherein the first part of word line and the pair of metal islands are disposed in a first metal layer, and the second part of word line is disposed in a second metal layer different from the first metal layer.

10. The device of claim 8, wherein the second part of word line is partially overlapped with a portion of at least one of the pair of metal islands.

11. The device of claim 8, wherein the pair of metal islands each has a maximum width, and at least one of the first part of word line or the second part of word line has a maximum width, which is greater than the maximum width of each of the pair of metal islands.

12. The device of claim 11, wherein the maximum width of the word line ranges from about 1.1 to about 1.5 times the maximum width of each of the pair of metal islands.

13. The device of claim 8, wherein the first part of word line comprises a zigzag shape.

14. The device of claim 8, wherein a portion of the first part of word line is sandwiched between the pair of metal islands.

15. A method, comprising:
   forming a pair of metal islands extending along a first direction, wherein in a layout view, the pair of metal islands are partially overlapped with at least one of a plurality of fin structures that extend along a second direction and are separated from a bit line that extend along the second direction; and
   forming a pair of connection metal lines extending along the second direction, wherein the pair of connection metal lines are separated from the bit line and the plurality of fin structures and cross over the pair of metal islands and a word line in the layout view.

16. The method of claim 15, further comprising:
   forming a second word line that extends in the second direction and fully covers the first word line.

17. The method of claim 16, wherein forming the second word line comprises:
   forming the second word line overlapping a portion of at least one of the pair of metal islands.

18. The method of claim 15, wherein forming the pair of metal islands comprises:
   forming the pair of metal islands locating at opposites sides of the first word line.

19. The method of claim 15, wherein in a layout view, forming the pair of metal islands comprises:
   forming the pair of metal islands at opposites sides of the bit line, and
   forming the pair of connection metal lines comprises:
   forming the pair of connection metal lines at the opposites sides of the bit line.

20. The method of claim 15, further comprising:
   forming a pair of cut metal line covering a portion of the pair of metal islands;
   cutting the portion of the pair of metal islands through the pair of cut metal line; and
   removing the pair of cut metal line.

* * * * *